United States Patent
Jung

(10) Patent No.: US 10,175,572 B2
(45) Date of Patent: Jan. 8, 2019

(54) METHODS OF FORMING PATTERNS USING NANOIMPRINT LITHOGRAPHY

(71) Applicant: SK hynix Inc., Gyeonggi-do (KR)

(72) Inventor: Woo Yung Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/588,925

(22) Filed: May 8, 2017

(65) Prior Publication Data

US 2018/0059537 A1    Mar. 1, 2018

(30) Foreign Application Priority Data

Aug. 29, 2016    (KR) .................. 10-2016-0109950

(51) Int. Cl.
G03B 27/42    (2006.01)
G03B 27/52    (2006.01)
G03F 7/00    (2006.01)

(52) U.S. Cl.
CPC .................................. G03F 7/0002 (2013.01)

(58) Field of Classification Search
CPC ....... B82Y 40/00; B82Y 30/00; G03F 7/0002; G03F 1/60; G03F 7/0015; G03F 7/16; G03F 7/20; G03F 7/2012; G03F 9/7042
See application file for complete search history.

(56) References Cited

U.S. PATENT DOCUMENTS

| | | | |
|---|---|---|---|
| 8,946,093 B2 | 2/2015 | Mani | |
| 2006/0177535 A1* | 8/2006 | McMackin | B82Y 10/00 425/385 |
| 2006/0266244 A1 | 11/2006 | Kruijt-Stegeman et al. | |
| 2010/0330807 A1* | 12/2010 | Kobayashi | B82Y 10/00 438/689 |
| 2013/0078820 A1* | 3/2013 | Mikami | G03F 7/0002 438/778 |

FOREIGN PATENT DOCUMENTS

KR    1020100056483    5/2010

OTHER PUBLICATIONS

Jung, W. et al., The opportunity and challenge of spin coat based nanoimprint lithography,Proc. SPIE 10144, Emerging Patterning Technologies, 1014412 (Mar. 21, 2017), doi:10.1117/12.2257845.

* cited by examiner

Primary Examiner — Mesfin Asfaw
(74) Attorney, Agent, or Firm — IP & T Group LLP

(57) ABSTRACT

A method of forming patterns is provided. The method includes forming a resist layer on a substrate, forming a lattice-shaped extrusion barrier region in the resist layer to define pattern transfer regions corresponding to a plurality of separate windows, and positioning a template on the resist layer so that a patterned surface of the template faces the resist layer. The patterned surface provides a plurality of transfer patterns. The template is pressed to perform an imprint step for embedding the transfer patterns of the template into the pattern transfer regions of the resist layer.

16 Claims, 16 Drawing Sheets

METHODS OF FORMING PATTERNS USING NANOIMPRINT LITHOGRAPHY

CROSS-REFERENCE TO RELATED APPLICATIONS

The present application claims priority under 35 U.S.C. 119(a) to Korean Application No. 10-2016-0109950, filed on Aug. 29, 2016, which is incorporated herein by reference in its entirety.

BACKGROUND

1. Technical Field

Various embodiments of the present disclosure relate generally to a method of forming fine patterns and more, particularly, to a method of forming fine patterns using a nanoimprint lithography technique.

2. Related Art

In the semiconductor industry, research efforts have been focused on developing technologies for transferring fine pattern images onto a wafer which can be employed in the development of integrated circuits with a high integration density. A nanoimprint lithography (NIL) technique has been evaluated as an attractive lithography technique which is efficiently usable for fabrication of nanostructures at a low cost. According to a typical NIL technique, a stamp, a template or a mold in which nanostructures are carved may be put on a resist layer which is spin-coated or dispensed on a wafer or a substrate, and the stamp (or one of the template and the mold) may be pressed toward the resist layer to transfer the nanostructures into the resist layer. The NIL technique may be typically categorized as either a thermal NIL technique or an ultraviolet NIL (UV-NIL) technique. The thermal NIL technique may require applying heat to a thermoplastic resist layer, while the UV-NIL technique may require irradiating a UV-ray onto a UV curable resist layer When the template having carved nanostructures is pressed toward the resist layer to transfer the pattern shapes of the carved nanostructures into the resist layer, portions of the resist layer may extrude or flow out of the template. The extrusion or flowage of the resist layer may cause a non-uniform thickness of the residual resist layer (i.e., a patterned resist layer) and extrusion structures of the residual resist layer. The non-uniform thickness of the residual resist layer or the protruded structures of the residual resist layer may lead to abnormal patterns.

SUMMARY

According to an embodiment, there is provided a method of forming patterns. The method includes forming a resist layer on a substrate, forming an extrusion barrier boundary region in the resist layer to define a plurality of exposure shot regions which are separated from each other, and aligning a template having a patterned surface with the resist layer. The patterned surface of the template includes patterned regions, an inter region between the patterned regions, and a boundary region surrounding the patterned regions and the inter region to have a closed loop shape in a plan view. Each of the patterned regions is comprised of a plurality of transfer patterns, and the template is aligned with the resist layer so that the boundary region overlaps with the extrusion barrier boundary region in the resist layer. The template is pressed to perform an imprint step for embedding the transfer patterns of the template into the resist layer.

According to another embodiment, there is provided method of forming patterns. The method includes forming a resist layer on a substrate, forming a lattice-shaped extrusion barrier region in the resist layer to define pattern transfer regions corresponding to a plurality of separate windows, and positioning a template on the resist layer so that a patterned surface of the template faces the resist layer. The patterned surface provides a plurality of transfer patterns. The template is pressed to perform an imprint step for embedding the transfer patterns of the template into the pattern transfer regions of the resist layer.

According to another embodiment, there is provided a method of forming patterns. The method includes forming a resist layer on a substrate, forming a lattice-shaped extrusion barrier region in the resist layer to define pattern transfer regions corresponding to a plurality of separate window and aligning a template having a patterned surface with the resist layer. The patterned surface of the template includes patterned regions, and each of the patterned regions is comprised of a plurality of transfer patterns. The template is pressed to perform an imprint step for embedding the transfer patterns of the template into the pattern transfer regions of the resist layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
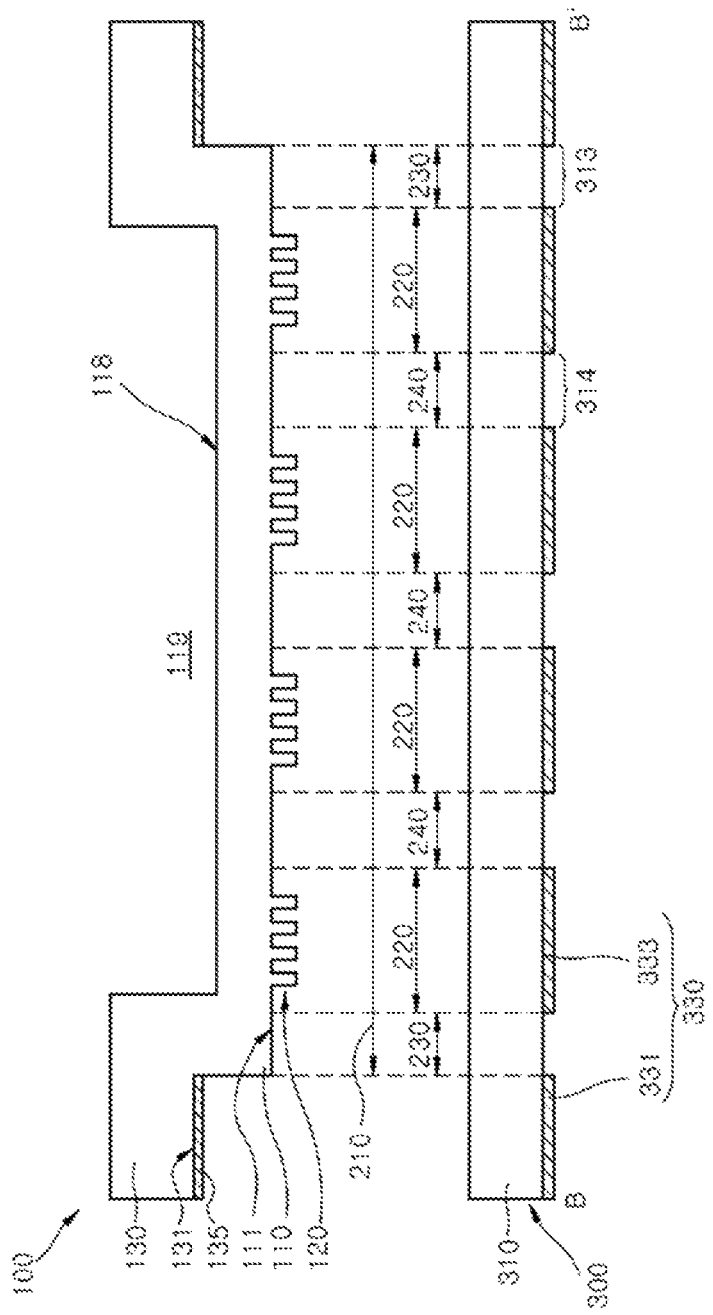
FIGS. 1, 2 and 3 illustrate a template and a barrier photomask used in a method of forming patterns according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although, the terms first second, third etc, may be used herein to describe various elements, these elements should not be limited by these terms. These terms are only used to distinguish one element from another element, but not used to define only the element itself or to mean a particular sequence. Thus, a first element in an embodiment could be termed a second element in other embodiments without departing from the teachings of the inventive concept.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

The following embodiments may be applied to implementation of integrated circuits such as dynamic random access memory (DRAM) devices, phase change random access memory (PcRAM) devices or resistive random access memory (ReRAM) devices. Moreover, the following embodiments may be applied to implementation of memory devices such as static random access memory (SRAM) devices, flash memory devices, magnetic random access memory (MRAM) devices or ferroelectric random access memory (FeRAM) devices. Furthermore the following embodiments may be applied to implementation of logic devices in which logic circuits are integrated.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
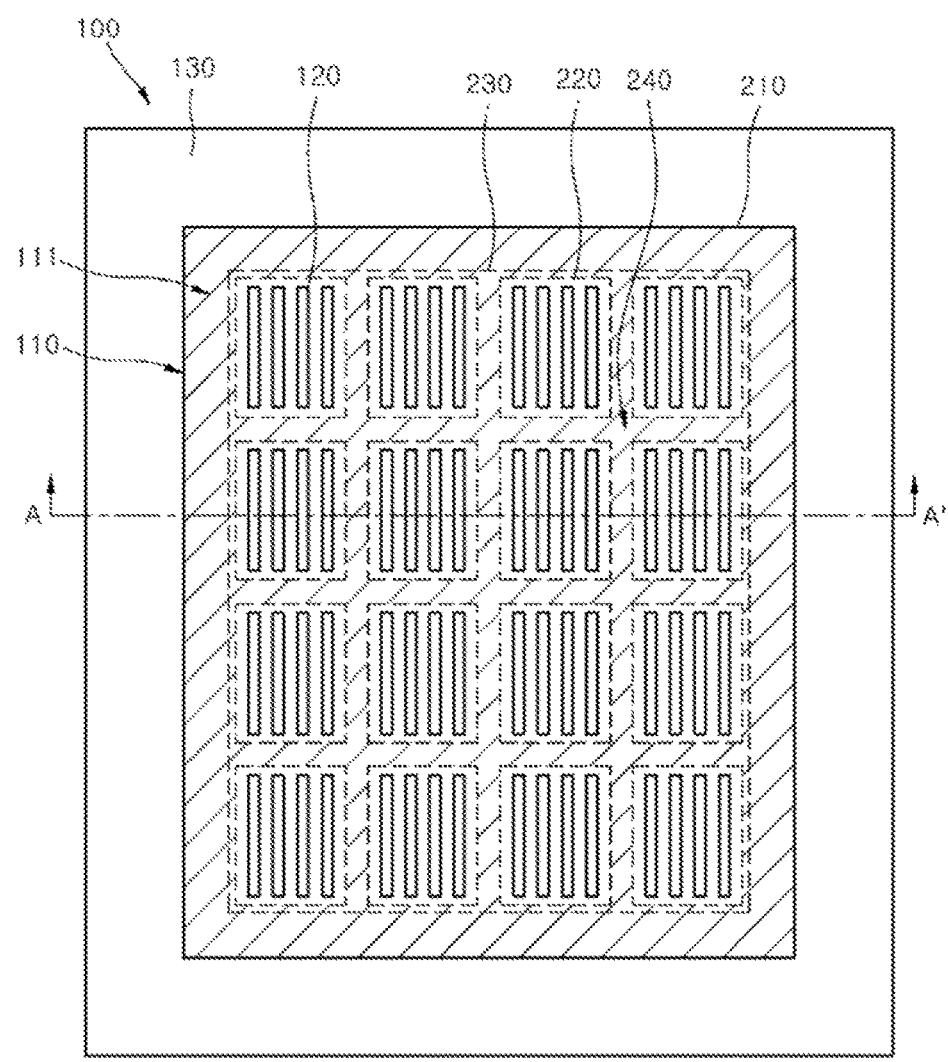
Figure 3:
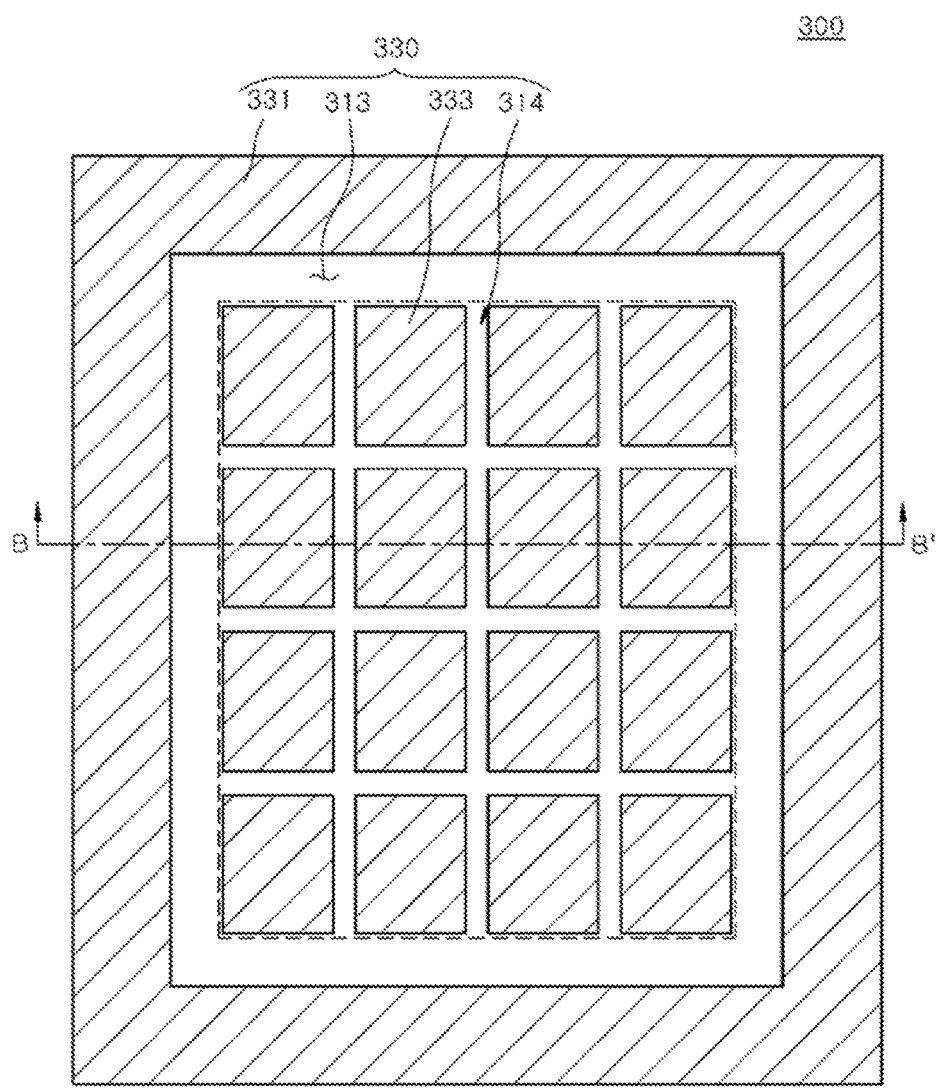

FIG. 1 is a cross-sectional view illustrating a template 100 and a barrier photomask 300 used in a method of forming fine patterns according to an embodiment of the present invention. FIG. 2 is a plan view illustrating a patterned surface 111 of the template 100 shown in FIG. 1. FIG. 3 is a plan view illustrating a surface of the barrier photomask 300 shown in. FIG. 1. FIG. 1 is a merged cross-sectional view taken along a line A-A' of FIG. 2 and a line B-B' of FIG. 3.

Referring to FIG. 1, the template 100 for a nanoimprint lithography (NIL) process may have the patterned surface 111 which includes transfer patterns 120 of a nanostructure to be transferred onto a resist layer. A process for transferring the nanostructure onto the resist layer will be described later. The template 100 may include a mesa portion 110 providing the patterned surface 111 defined by the transfer patterns 120 and a body portion 130 supporting the mesa portion 110. The mesa portion 110 may protrude from the body portion 130. The body portion 130 of the template 100 may have a top recessed surface 118 which is opposite to the patterned surface 111. The top recessed surface 118 of the body portion 130 may define a cavity 119. The mesa portion 110 may be easily transformed because of the presence of the cavity 119. That is, when the patterned surface 111 of the mesa portion 110 is in contact with the resist layer or is detached from the resist layer, the patterned surface 111 of the mesa portion 110 may easily warp to have a convex shape due to the cavity 119.

A light blocking layer 135 may be disposed on a bottom surface 131 of the body portion 130 which is not covered by the mesa portion 110. The light blocking layer 135 may block the light which is used for curing the resist layer, for example, an ultraviolet (UV) ray. The mesa portion 110 may protrude from the surface 131 of the body portion 130. Thus, a level difference (i.e., step) may exist between the patterned surface 111 of the mesa portion 110 and the surface 131 of the body portion 130.

Referring to FIGS. 1 and 2 the patterned surface 111 of the mesa portion 110 may have a rectangular shape in a plan view. An entire region of the patterned surface 111 may correspond to an imprinting shot region 210 defined by a single shot of the NIL process. A plurality of patterned regions 220 may be disposed, in the imprinting shot region 210, and each of the patterned regions 220 may include a plurality of transfer patterns 120. The patterned regions 220 may correspond to cell regions of memory semiconductor devices such as DRAM devices. Boundary regions 230 may be disposed to surround the patterned regions 220 and to provide an outer boundary of the patterned regions 220. The boundary regions 230 may be an edge region of the patterned surface 111 and may be a pattern forbidden region in which no pattern is disposed. Another pattern forbidden region may be disposed between the patterned regions 220 to provide inter regions 240 that separate the patterned regions 220 from each other. The pattern forbidden region including the boundary regions 230 and the inter regions 240 may be disposed to have a lattice or a grid shape in a plan view. That is, the patterned surface 111 of the mesa portion 110 may be configured to include the patterned regions 220, each of which is disposed in any one of windows that are defined by the lattice-shaped pattern forbidden region. The transfer patterns 120 as shown in FIG. 2 may have an elongated rectangular (or linear) shape. Also, a plurality, for example, four transfer patterns 120 may be spaced apart at a regular interval within each patterned region 220. Hence, as shown in FIG. 2, each patterned region includes a plurality of parallel, transfer patterns 120. It is noted that the present disclosure is not limited to the aforementioned shape and configuration. For example, the transfer patterns 120 may have a shape other than the line shape. For example, the transfer patterns 120 may have a concave or a convex shape. Also, fewer than four or more than four transfer patterns 120 may be configured within each pattern region 220. Also, the patterned regions 220 as shown in FIG. 2, have a rectangular shape, however, it is noted that the invention is not limited to such a shape.

Referring to FIGS. 1 and 3, the barrier photomask 300 may be used in an exposure step for forming an extrusion barrier region in a resist layer where the transfer patterns 120 of a nanostructure are imprinted and may be designed based on the patterned surface 111 of the mesa portion 110 of the template. A process for forming the extrusion barrier region will be described later. The barrier photomask 300 may include an opaque pattern 330 that define first and second light transmitting regions 313 and 314 which correspond to the pattern forbidden regions 230 and 240 of FIG. 2, of the patterned surface 111 of the mesa portion 110, respectively. The barrier photomask 300 may be configured to include a transparent substrate 310 and the opaque pattern 330 disposed on a bottom surface of the transparent substrate 310. The transparent substrate 310 may be made of any suitable transparent material. The opaque pattern 330 may be made of a light blocking material. For example, in an embodiment, the transparent substrate 310 may be a quartz substrate and the opaque pattern 330 may be light blocking pattern formed of a chrome (Cr) material. The barrier photomask 300 may be fabricated to have a binary mask structure. The barrier photomask 300 may be fabricated to have a reflective type mask structure or a phase shift type mask structure.

The opaque pattern 330 may include region opaque patterns 333 located in regions corresponding to the patterned regions (220 of FIG. 2) of the patterned surface 111 of the mesa portion 110 and a frame opaque pattern 331 located on edge regions of the barrier photomask 300. The second light transmitting region 314 between the region opaque patterns 333 may correspond to the inter region 240, and the first light transmitting region 313 between the frame opaque pattern 331 and the region opaque patterns 333 may correspond to the boundary region 230. Although FIG. 1 illustrates an example in which the first and second light transmitting regions 313 and 314 of the photomask 300 are designed to respectively correspond to the boundary region 230 and the inter region 240 of the template 100 in an area ratio of 1:1, the present disclosure is not limited thereto. For example, if an exposure step is performed using a shrinkage exposure technique in an area ratio of 4:1, the first and second light transmitting regions 313 and 314 of the photomask 300 may be designed to have planar areas which are four times the planar areas of the boundary region 230 and the inter region 240 of the template 100.

FIGS. 4 to 7 illustrate a step of forming an extrusion barrier region 510 in a resist layer 500.

Figure 4:
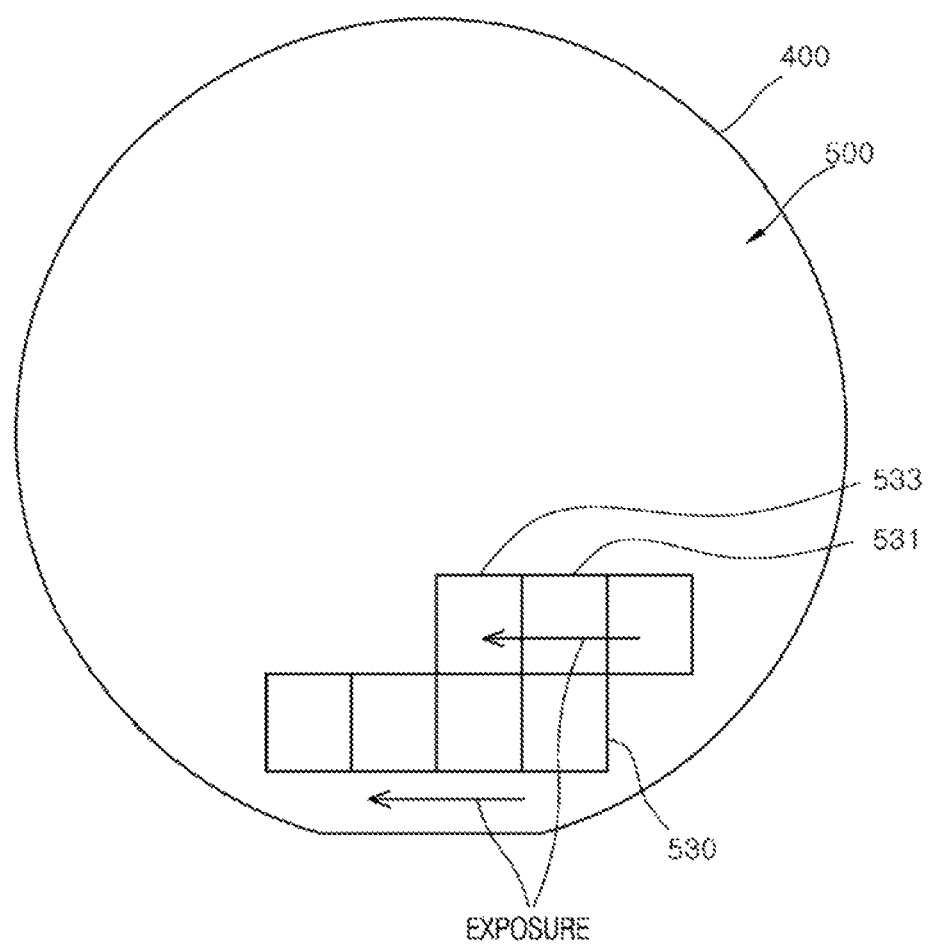
FIGS. 4 to 7 illustrate a step of forming an extrusion barrier region in a method of forming patterns according to an embodiment.
Figure 5:
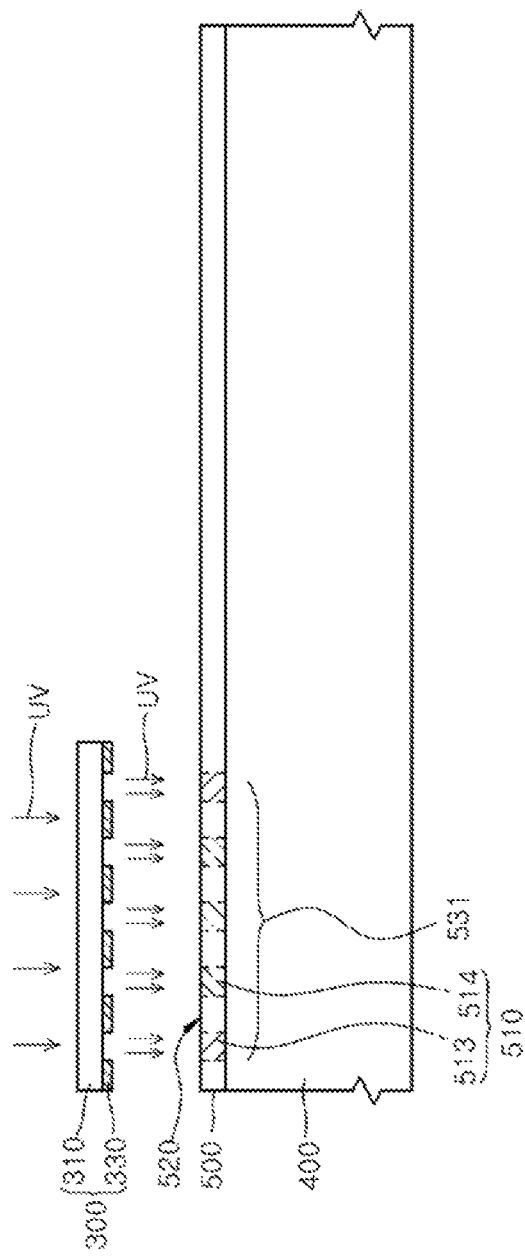

Referring to FIGS. 4 and 5, the resist layer 500 may be formed on a substrate 400 such as a wafer. The resist layer 500 may be formed of a thin layer of a curable coating material. In an embodiment, the resist layer may be formed of a resin material containing photosensitizers or photo initiator. The resist layer may include UV curable material used in UV imprint lithography. The resist layer may include typically a monomer such as an acrylate or methacrylate. In general, any photopolymerizable material could be used, such as a mixture of monomers and an initiator in the resist layer. The curable resist layer may also, for instance, include a dimethyl siloxane derivative. Such resist materials are less viscous than the thermosetting and thermoplastic resins used in hot imprint lithography and consequently move much faster to fill template pattern features. Low temperature and low pressure operation also favors higher throughput capabilities.

The resist layer can be cured by exposure to light such as UV light. Other wavelengths of light than UV may also be used for curing the resist layer. The resist layer may have a suitable viscosity so that it may be imprintable when it is not cured. Hence, the resist layer 500 may be formed of an imprintable, photo-curable resin on which the transfer patterns 120 of the template (100 of FIG. 1) can be imprinted. The resist layer 500 may be formed by spin-coating of the imprintable, resist material on the substrate 400.

A portion of the resist layer 500 may be cured to form the extrusion barrier region 510. Specifically, an exposure light, for example, an ultraviolet (UV) ray may be selectively irradiated onto a portion of the resist layer 500 using the barrier photomask 300 to form the extrusion barrier region 510 that is cured by the UV ray. The barrier photomask 300 may be loaded on the resist layer 500 so that the light transmitting regions 313 and 314 of the photomask 300 in FIG. 3 are aligned with a predetermined portion of the resist layer 500, and an exposure light may be irradiated onto the barrier photomask 300 to perform a barrier exposure step for curing the predetermined portion of the resist layer 500. As a result, the predetermined portion of the resist layer 500 may be selectively cured by the exposure light passing through the light transmitting regions 313 and 314 of the photomask 300 to form the extrusion barrier region 510.

The barrier exposure step may correspond to a curing step for forming the extrusion barrier region 510 in the resist layer 500. Accordingly, the cured portion of the resist layer 500 may be the extrusion barrier region 510. The cured portion (i.e., the extrusion barrier region 510) of the resist layer 500 may have a hardened state whose fluidity is lower than the fluidity of non-cured portions 520 of the resist layer 500. Thus, the extrusion barrier region 510 may act as a dam that prevents the non-cured portions 520 from being extruded in subsequent process steps. The non-cured portions 520 of the resist layer 500 may correspond to the patterned regions (220 of FIG. 1) of the template (100 of FIG. 1) and may have a sufficient fluidity to imprint the transfer patterns (120 of FIG. 1) of the template (100 of FIG. 1) thereon in a subsequent process. The non-cured portions 520 of the resist layer 500 may be set as pattern transfer regions on which the transfer patterns (120 of FIG. 1) of the template (100 of FIG. 1) are transferred. The extrusion barrier region 510 may be comprised of the cured portion of the resist layer 500. Thus, no pattern may be imprinted on the extrusion barrier region 510. That is, the extrusion barrier region 510 may be a pattern transfer forbidden region.

Figure 6:
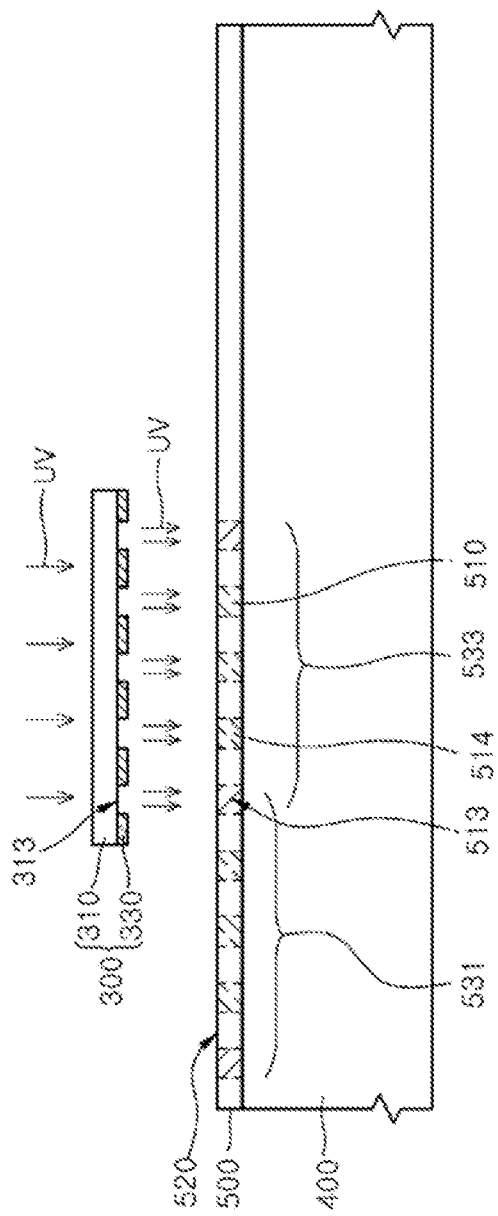

The exposure step using the barrier photomask (300 of FIG. 1) may be applied to exposure shot regions (530 of FIG. 4) of the resist layer 500. As illustrated in FIG. 5, the barrier photomask 300 may be aligned with a first exposure shot region 531 of the resist layer 500, and an exposure light (e.g., an UV ray) may be irradiated onto the barrier photomask 300 to perform a first barrier exposure step. After the first barrier exposure step, the barrier photomask 300 may be aligned with a second exposure shot region 533 adjacent to the first exposure shot region 531 and an exposure light (e.g., an UV ray) may be irradiated onto the barrier photomask 300 to perform a second barrier exposure step, as illustrated in FIG. 6.

Each of the exposure shot regions 530 may be a region corresponding to the imprinting shot region (210 of FIG. 1) of the template (100 of FIG. 1). The extrusion barrier region 510 may be formed to correspond to the pattern forbidden region (230 and 240 of FIG. 1) of the template (100 of FIG. 1). That is, the extrusion barrier region 510 may include an extrusion barrier boundary region 513 corresponding to the boundary region (230 of FIG. 1) of the template 100 and an extrusion barrier inter region 514 corresponding to the inter region (240 of FIG. 1) of the template 100. When the second barrier exposure step is performed, the barrier photomask 300 may be aligned with the second exposure shot region 533 of the resist layer 500 so that the first light transmitting region 313 of the barrier photomask 300 overlaps with the extrusion barrier boundary region 513 of the first exposure shot region 531. Accordingly, the extrusion barrier boundary region 513 may be located at a boundary region between the first and second exposure shot regions 531 and 533.

Figure 7:
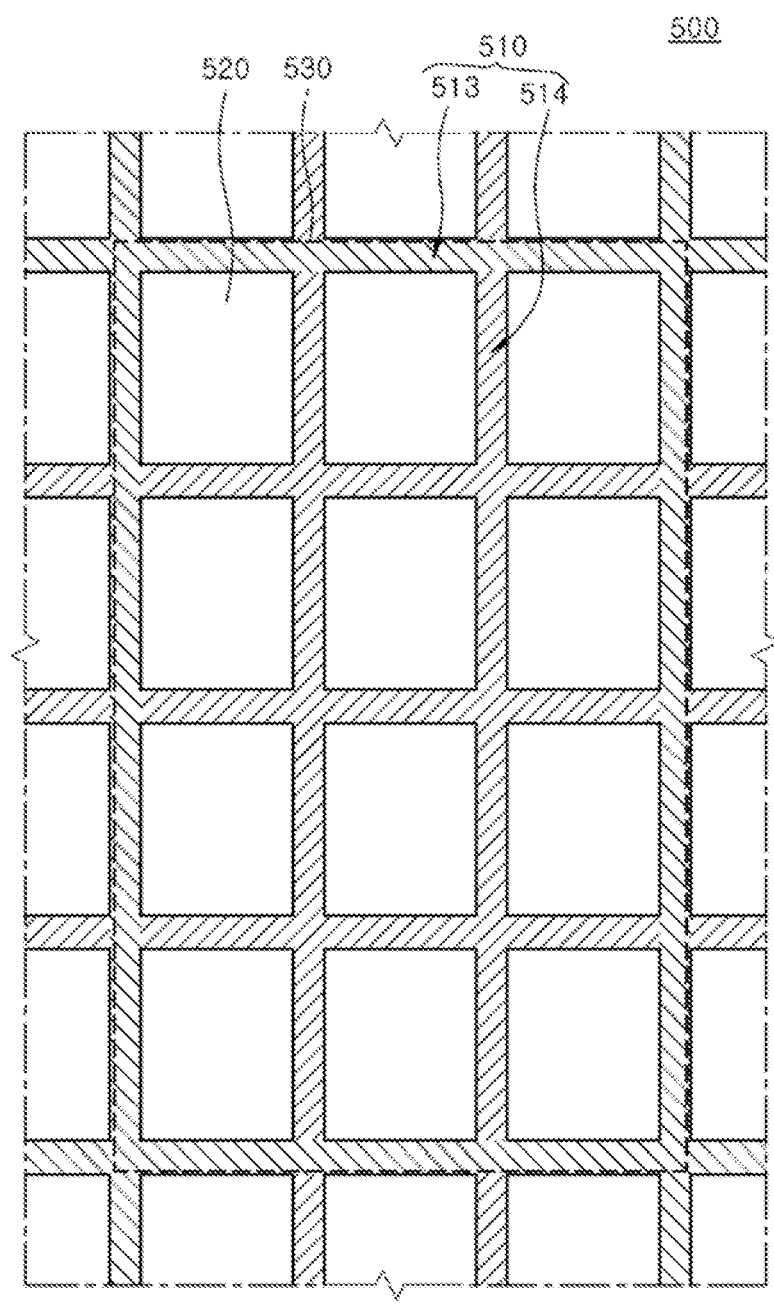

FIG. 7 is a plan view illustrating the extrusion barrier region 510 which is formed in the resist layer 500 by sequentially applying the barrier exposure step to the exposure shot regions (530 of FIG. 4). The extrusion barrier region 510 includes the extrusion barrier boundary region 513 and the extrusion barrier inter region 514. The extrusion barrier region 510 may be formed by selectively exposing predetermined portions of the resist layer 500 to an exposure light with the barrier photomask 300. The extrusion barrier region 510 may be formed to have a lattice shape that defines a plurality of separate windows corresponding to the pattern transfer regions 520 of the resist layer 500. The pattern transfer regions 520 in each exposure shot region 530 may be defined to be spaced apart from each other by the extrusion barrier inter region 514. The pattern transfer regions 520 may be surrounded by the extrusion barrier boundary region 513 having a rectangular closed loop shape.

Figure 11:
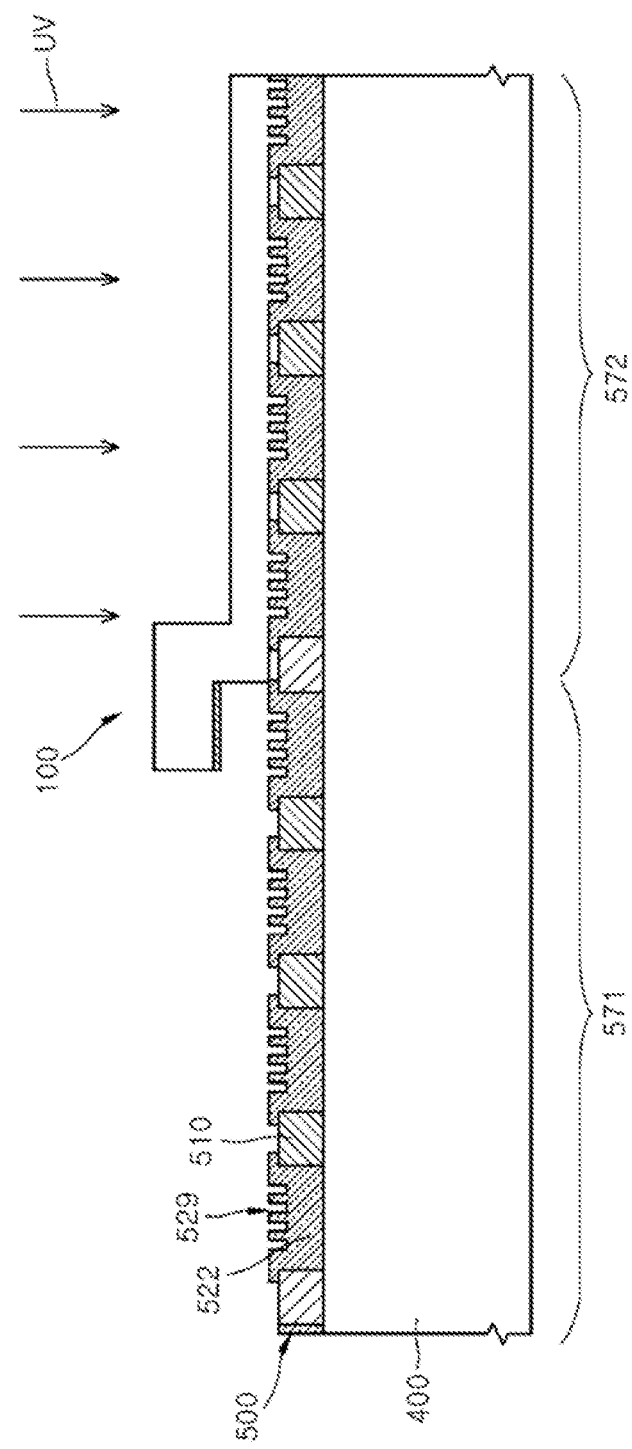
Figure 12:
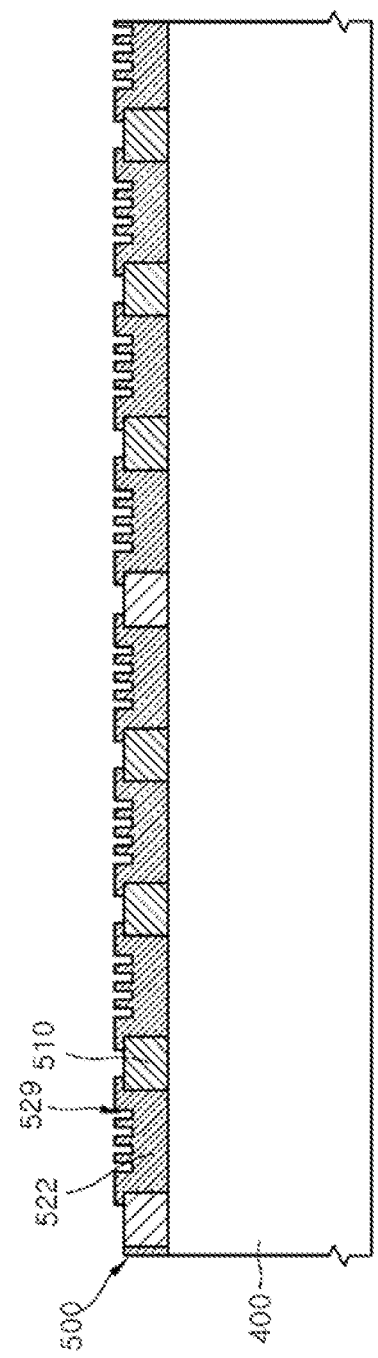
Figure 13:
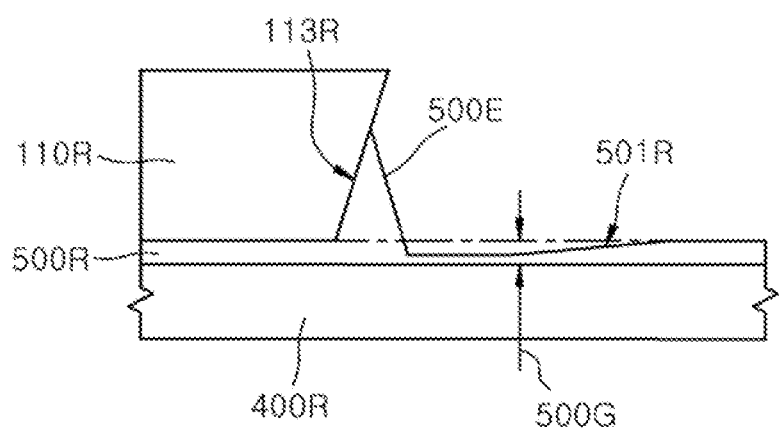
FIGS. 13 and 14 are cross-sectional views illustrating comparative examples that an extruded portion of a resist layer is formed.
Figure 14:
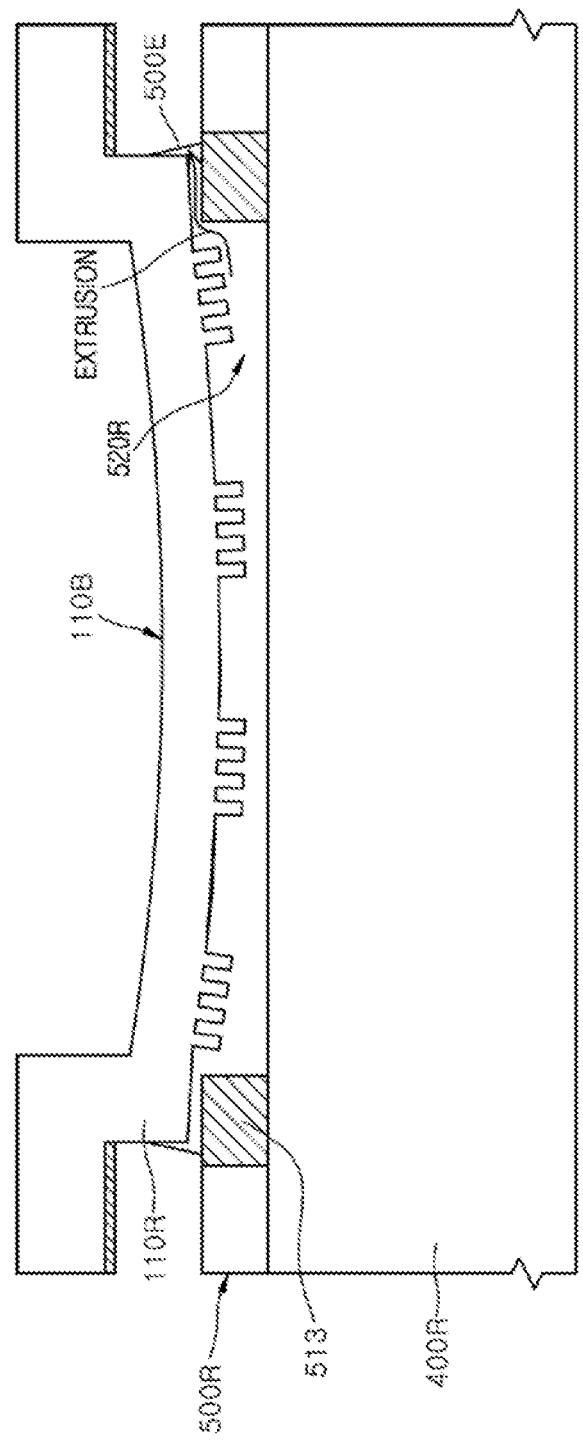

FIGS. 8 to 12 illustrate a step of transferring nanostructural patterns of the template 100 onto the resist layer 500 in a method of forming fine patterns according to an embodiment of the present invention. FIGS. 13 and 14 are cross-sectional views illustrating comparative examples that an extruded portion 500E of the resist layer 500 is formed.

Figure 8:
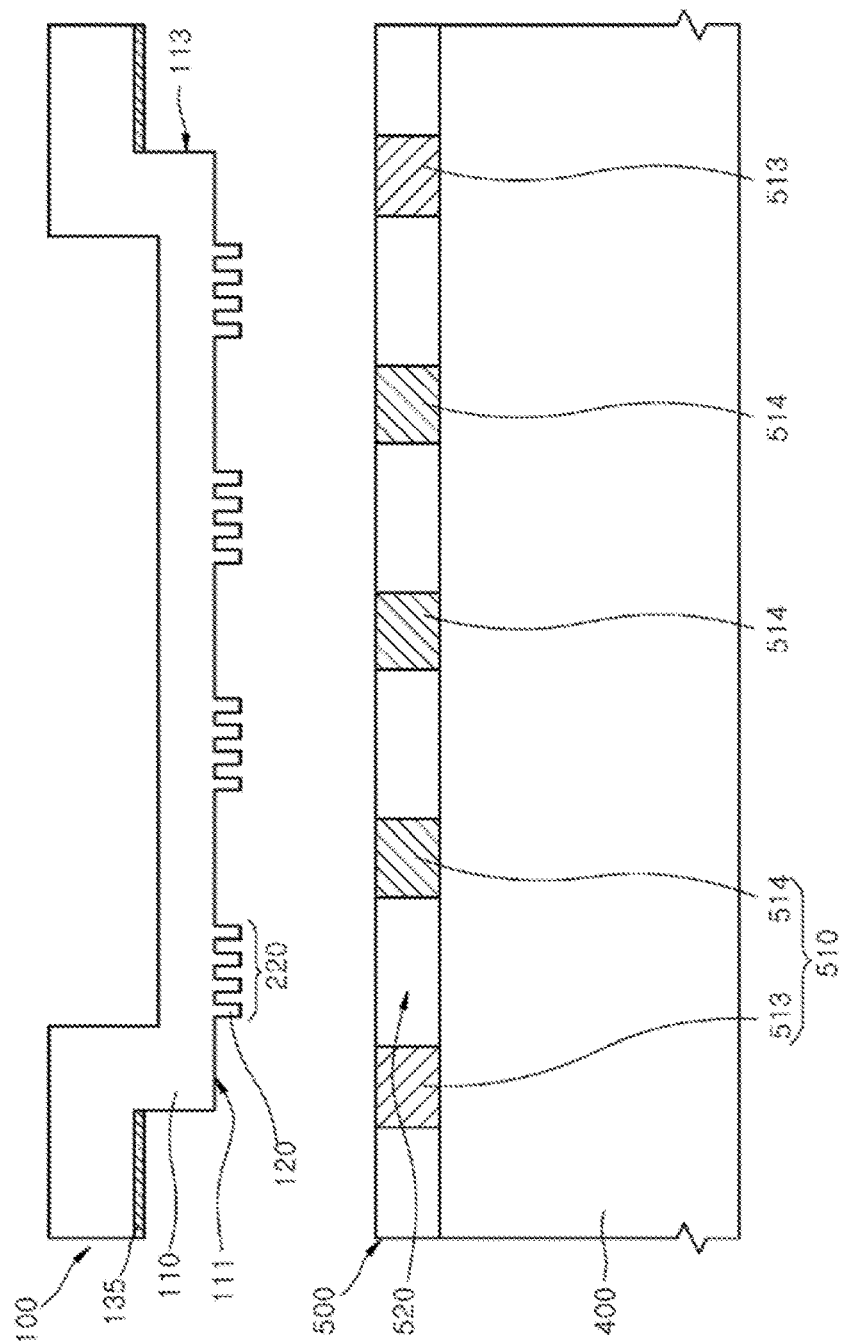
FIGS. 8 to 12 illustrate a step of transferring patterns of a template onto a resist layer in a method of forming patterns according to an embodiment.

Referring to FIG. 8, the template 100 may be placed over or on the resist layer 500 in which the extrusion barrier region 510 is formed. Specifically the template 100 may be aligned with the substrate 400 so that the patterned surface 111 of the template 100 faces the resist layer 500. The resist layer 500 as described earlier may be spin coated on the substrate 400. The substrate 400 may be a semiconductor substrate. The resist layer 500 may be formed as an imprintable medium. The template 100 may be aligned with the substrate 400 so that the vertical sidewall 113 of the mesa portion 110 of the template 100 overlap with the extrusion barrier boundary region 513 of the resist layer 500. The template 100 may also be aligned with the resist layer 500 so that the patterned regions 220 of the patterned surface 111 of the template 100 respectively fully overlap with the pattern transfer regions 520 of the resist layer 500. Stated otherwise the template 100 may also be aligned with the resist layer 500 so that when viewed from the top the patterned regions 220 of the patterned surface 111 of the template 100 fall fully within corresponding pattern transfer regions 520 of the resist layer 500.

Figure 9:
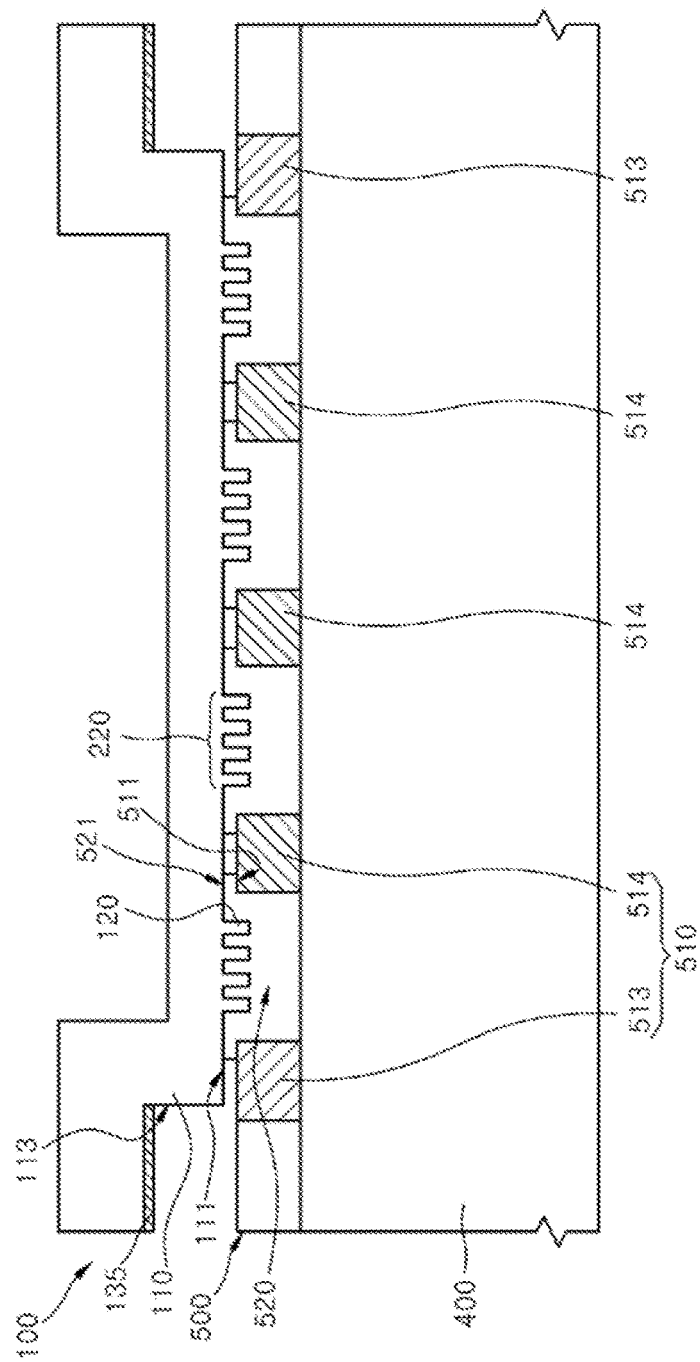

Referring to FIG. 9, the template 100 may be moved downwardly so that the transfer patterns 120 included in the patterned regions 220 of the template 100 come into in contact with the pattern transfer regions 520 of the resist layer 500. The template 100 may be pressed down for embedding the transfer patterns 120 of the template 100 into the pattern transfer regions 520 of the resist layer 500. As a result, the transfer patterns 120 of the template 100 may be imprinted on the pattern transfer regions 520 which contain the imprintable resist material. Some of the imprintable resist material of the pattern transfer regions 520 may be extruded out of the pattern transfer regions 520 as indicated by portions 521. However, according to the present embodiment, the extrusion barrier region 510 acts as a barrier dam that slows or substantially prevents the resist imprintable material to be extruded out of the pattern transfer regions 520 during the imprinting step. Thus, while the imprint step is performed, formation of the extruded portions 521 is significantly limited by the extrusion barrier region 510 so that the extruded portions 521 may not reach the sidewalls 113 of the mesa portion 110 of the template 100 and may only partially cover a top surface 511 of the extrusion barrier region 510.

FIG. 13 illustrates a comparative example in which the extrusion barrier region (510 of FIG. 9) is not formed in a resist layer 500R coated on a substrate 400R.

Referring to FIG. 13, if a mesa portion 110R corresponding to the mesa portion 110 of FIG. 9 is in contact with the resist layer 500R and the imprint step is performed, a portion 500E of the resist layer 500R may extrude out of the mesa portion 110R due to a pressure generated by the mesa portion 110R that is pressed down. The extruded portion 500E of the resist layer 500R extends to cover a sidewall 113R of the mesa portion 110R due to a surface tension at the sidewall 113R of the mesa portion 110R. In such a case, another portion 501R of the resist layer 500R adjacent to the mesa portion 110R also moves onto the sidewall 113R of the mesa portion 110R due to the surface tension at the sidewall 113R of the mesa portion 110R. Thus, a thickness 500G of the other portion 501R of the resist layer 500R may be reduced to cause a non-uniform thickness of a residual layer of the resist layer 500R after the imprint step. The non-uniform thickness of the residual resist layer may lead to formation of abnormal patterns.

Referring to FIGS. 9 and 13, while the imprint step is performed to embed the transfer patterns 120 of the template 100 into the pattern transfer regions 520 of the resist layer 500, the extrusion barrier region (510 of FIG. 9) may suppress or substantially prevent extrusion of the resist layer 500. Since the extrusion barrier boundary region 513 of the extrusion barrier region 510 is located to be adjacent to the edges of the mesa portion 110 of the template 100, the extrusion barrier boundary region 513 may efficiently suppress or substantially prevent that the extruded portions 521 extrude toward an outside region of the mesa portion 110. Because the extrusion barrier region 510 suppresses the extension of the extruded portions 521, the extrusion barrier region 510 may prevent formation of the extruded portion 500E which is described with reference to FIG. 13. Accordingly, after the imprint step, the extrusion barrier region 510 may prevent the degradation of a thickness uniformity of the residual resist layer 500.

Referring again to FIG. 9, the extrusion barrier inter region 514 may also act as a dam that suppresses movement or flowage of the resist material of the pattern transfer regions 520. In addition, the extrusion barrier inter region 514 may suppress a lowering phenomenon or a bowing phenomenon that the mesa portion 110 of the template 100 warps or bows when the template 100 is pressed down toward the resist layer 500 or is detached from the resist layer 500. That is, the extrusion barrier inter region 514 may act as a supporter for supporting the patterned surface 111 of the mesa portion 110 when the template 100 is pressed down toward the resist layer 500 or is detached from the resist layer 500. Thus, the mesa portion 110 of the template 100 may not warp or bow while the imprint step is performed thus resulting in a more precise imprinting step.

FIG. 14 illustrates a comparative example in which the extrusion barrier inter region (514 of FIG. 9) is not formed in the resist layer 500R coated on the substrate 400R.

Referring to FIG. 14, if the mesa portion 110R is in contact with the resist layer 500R and the imprint step is performed, a central portion 110E of the mesa portion 110R may pressed down by a stamping pressure applied to the mesa portion 110R to cause the mesa portion to curve. In such a case, extrusion of the resist layer 500R out of the pattern transfer region 520R is increased and forms the extruded portion 500E on the sidewalls of the mesa portion 110S, as illustrated in FIG. 14.

Hence, referring to FIGS. 9 and 14, the extrusion barrier inter region 514 may support the patterned surface 111 of the mesa portion 110 when the template 100 is pressed down toward the resist layer 500 to perform the imprint step to effectively prevent any substantial curving of the mesa layer 500. Thus, the extrusion barrier inter region 514 prevents application of an excessive pressure to the resist material of the pattern transfer regions 520 which contact the transfer patterns 120 of the template 100. As a result, extrusion of the resist material out of the pattern transfer regions 520 is suppressed or substantially prevented during the imprinting step. Accordingly, a thickness uniformity of the residual layer of the resist layer 500 may not be degraded even though the imprint steps are performed. As a result, accurate and fine nano-patterns may be imprinted on the resist layer 500.

Figure 10:
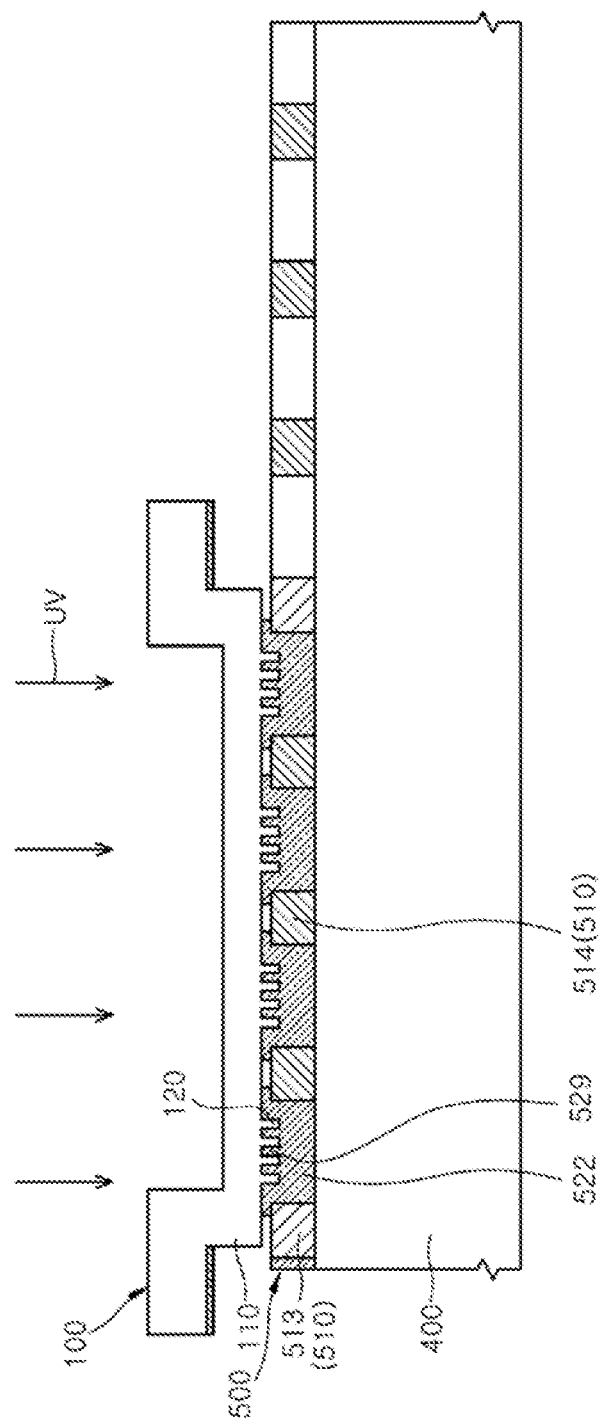

Referring to FIG. 10, after the transfer patterns 120 of the template 100 are embedded in the pattern transfer regions 520 of the resist layer 500 by the imprint step, the pattern transfer regions 520 of the resist layer 500 may be cured. In an embodiment, an exposure light, for example, an ultraviolet (UV) ray may be irradiated onto the barrier photomask 100 to cure the pattern transfer regions 520 after the transfer patterns 120 of the template 100 are embedded in the pattern transfer regions 520 of the resist layer 500 by the imprint step. As a result, the pattern transfer regions 520 may be hardened to provide cured pattern transfer regions 522 and resist patterns 529. Accordingly, as a result of the imprint step, the transfer patterns 120 of the template 100 may be transferred and imprinted on the pattern transfer regions 520 to form the resist patterns 529.

Referring to FIG. 11, after the imprint step for forming the resist patterns 529 is applied to a first imprint shot region 571 of the resist layer 500, the template 100 may be detached from the resist layer 500 and may be shifted and aligned with a second imprint shot region 572 of the resist layer 500. Subsequently, the imprint step may be performed to form, the resist patterns 529 in the second imprint shot region 572. The imprint step may be repeatedly applied to all of imprint shot regions of the substrate 400 using the template 100. As a result, the resist patterns 529 may be formed in an entire portion of the resist layer 500 coated on the substrate 400, as illustrated in FIG. 12.

Figure 15:
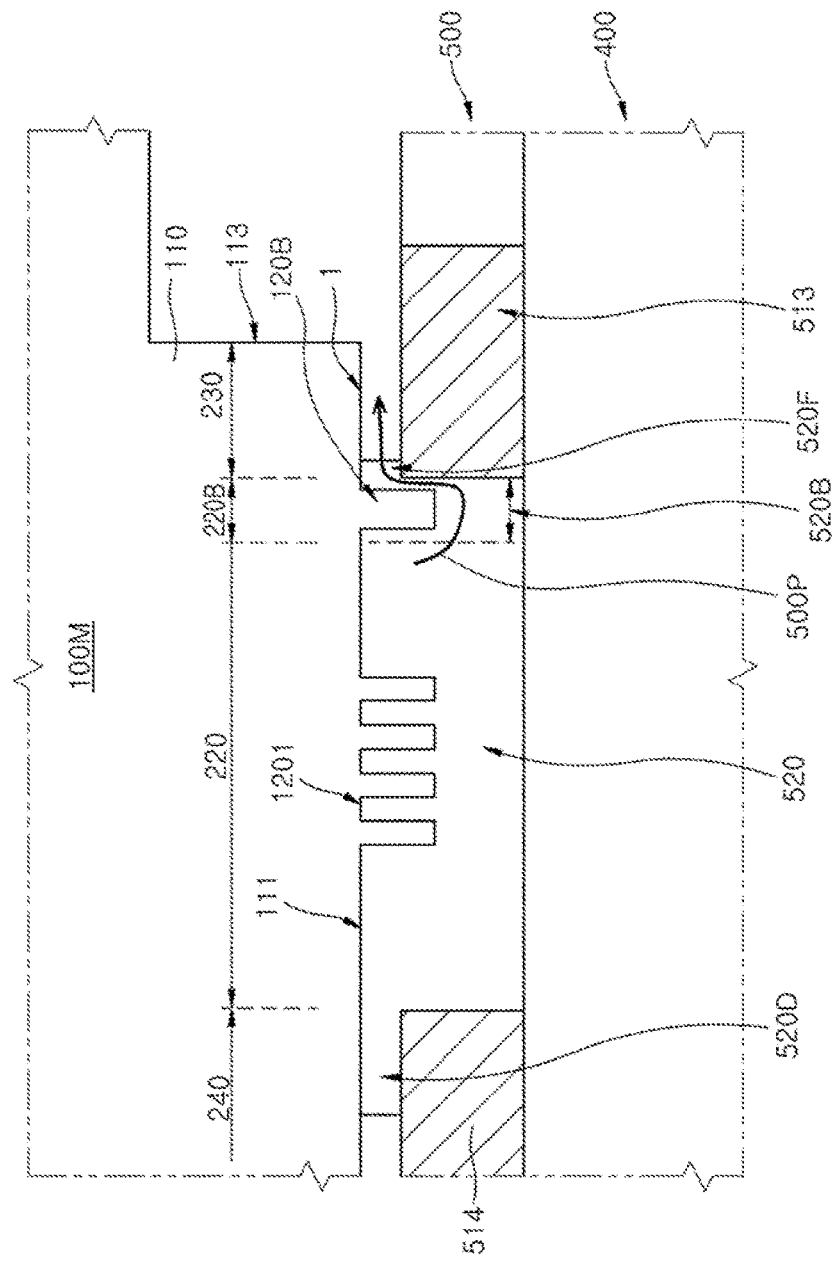
FIG. 15 illustrates a template and a step of transferring patterns according to an embodiment.
Figure 16:
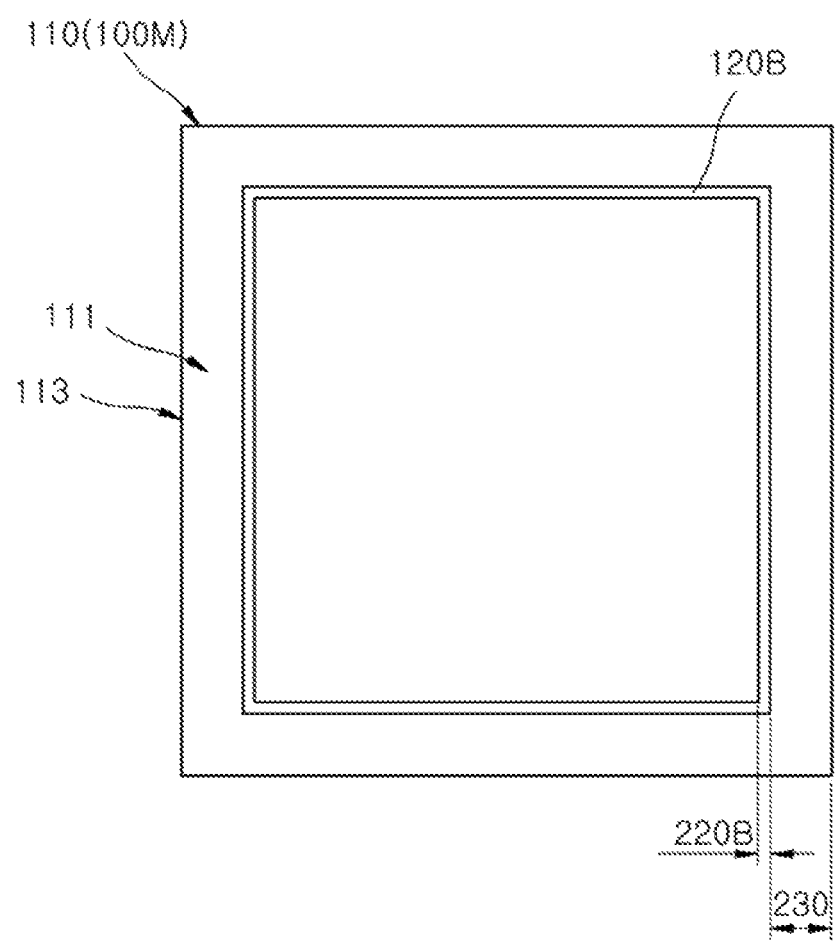
FIG. 16 illustrates a dam pattern of a template according to an embodiment

FIG. 15 is a cross-sectional view illustrating a template 100M and a step of transferring patterns according to an embodiment, FIG. 16 is a plan view illustrating a dam pattern 120B of the template 100M shown in FIG. 15.

Referring to FIG. 15, the template 100M for the nanoimprint lithography (NIL) process may further have a dam pattern 120B between the transfer patterns 120 and the vertical sidewall 113 of the mesa portion 110. The dam pattern 120B may be a nanostructure to be transferred onto the resist layer 500. The dam pattern 120B may be formed as a rectangular wall extended along with the vertical sidewall 113 of the mesa portion 110 as shown in FIG. 16. The dam pattern 120B may be protruded from the patterned surface 111. The dam pattern 120B may have a larger size than the transfer patterns 120.

The dam pattern 120B may be formed in a dam region 220B. The dam region 220B may be a region between the boundary region 230 and the patterned region 220 of the patterned surface 111. The dam region 220B may face adjacently to the boundary region 230. The dam region 220B may be an outer region of the patterned region 220 adjacent to the boundary region 230 and extending along with the boundary region 230.

In the imprinting step, the dam pattern 120B is embedded into a dam region 520B of the resist layer 500. The dam region 520B of the resist layer 500 may be a region between the extrusion barrier boundary region 513 and the pattern transfer regions 520. The dam region 520B of the resist layer 500 faces and is adjacent to the extrusion barrier boundary region 513. The dam region 520B of the resist layer 500 may be affected by a flare of UV light that cures the extrusion barrier boundary region 513 from the resist layer 500. The dam region 520B of the resist layer 500 may be partially cured by the flare of UV light. The dam region 520B of the resist layer may have a sticky state induced from the partial curing. In the barrier exposure step of FIG. 5, a proximity effect by the flare may be enhanced by placing the barrier photomask 300 closer to the resist layer 500 so that the dam region 520B of the resist layer may get the sticky state easier.

When the dam pattern 120B is imprinted into the dam region 520B of the resist layer 500, the imprinted dam pattern 120B may act as an additional barrier to obstruct the path 500P from which the resist flows out from the pattern transfer region 520. An extruded portion 520F on the extrusion barrier boundary region 513 may be restricted to a relatively small size by the dam pattern 120B as compared with another extruded portion 520D on the extrusion barrier inter region 514. The dam pattern 120B may prevent the extruded portions 520F from reaching the sidewalls 113 of the mesa portion 110 of the template 100M.

According to the embodiments described above, nanoscale structures or nano structures can be fabricated on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nano-scaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form in a bare die form or in a package form. The IC chips may also be supplied in a single chip package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art will appreciate that various modifications, additions and substitutions are possible, without departing from the scope and spirit of the present disclosure and the accompanying claims

What is claimed is:

1. A method of forming patterns, the method comprising:
   forming a resist layer on a substrate;
   selectively irradiating an exposure light onto portions of the resist layer to form an extrusion barrier boundary region and an extrusion barrier inter region in the resist layer to define a plurality of non-cured regions which are separated from each other;
   aligning a template having a patterned surface with the resist layer, wherein the patterned surface of the template includes patterned regions, at least one inter region between the patterned regions, and at least one boundary region surrounding the patterned regions and the inter region to have a closed loop shape in a plan view, wherein each of the patterned regions includes a plurality of transfer patterns, and wherein the template is aligned with the resist layer so that the boundary region overlaps with the extrusion barrier boundary region in the resist layer; and
   pressing the template to perform an imprint step for embedding the transfer patterns of the template into the resist layer, wherein the transfer patterns of the template are embedded into the non-cured portions, and,
wherein the extrusion barrier boundary region and an extrusion barrier inter region are formed to have a lattice shape in a plan view.

2. The method of claim 1, wherein the extrusion barrier boundary region is formed by selectively curing the portions of the resist layer with the exposure light.

3. The method of claim 2, wherein selectively curing the portions of the resist layer includes:
aligning a photomask including opaque patterns and at least one light transmitting region defined by the opaque patterns with the resist layer so that the light transmitting region overlaps with a portion of the resist layer; and
irradiating an exposure light onto the photomask so that the exposure light selectively reaches the portion of the resist layer through the light transmitting region.

4. The method of claim 1, wherein forming the extrusion barrier inter region and the extrusion barrier boundary region includes:
positioning a photomask including opaque patterns and at least one light transmitting region defined by the opaque patterns on the resist layer, wherein the light transmitting region is located to correspond to the extrusion barrier inter region and the extrusion barrier boundary region; and
irradiating an exposure light onto the photomask so that the exposure light selectively reaches the portions of the resist layer through the light transmitting region.

5. The method of claim 1, wherein the resist layer is formed by spin-coating a resist material on the substrate.

6. The method of claim 1, wherein the template includes a dam pattern, the dam pattern to be imprinted into a portion between the extrusion barrier boundary region and the patterned region.

7. A method of forming patterns, the method comprising:
forming a resist layer on a substrate;
selectively irradiating an exposure light onto a portion of the resist layer to form a lattice shaped extrusion barrier region in the resist layer to define a plurality of pattern transfer regions corresponding to a plurality of separate windows;
positioning a template on the resist layer so that a patterned surface of the template faces the resist layer, wherein the patterned surface provides a plurality of transfer patterns; and
pressing the template to perform an imprint step for embedding the transfer patterns of the template into the pattern transfer regions of the resist layer.

8. The method of claim 7, wherein the extrusion barrier region is formed by selectively curing the portion of the resist layer with the exposure light.

9. The method of claim 8, wherein selectively curing the portion of the resist layer includes:
aligning a photomask including opaque patterns and at least one light transmitting region defined by the opaque patterns with the resist layer so that the light transmitting region overlaps with a portion of the resist layer; and
irradiating an exposure light onto the photomask so that the exposure light selectively reaches the portion of the resist layer through the light transmitting region.

10. The method of claim 7, wherein the resist layer is formed by spin-coating a resist material on the substrate.

11. A method of forming patterns, the method comprising:
forming a resist layer on a substrate;
selectively irradiating an exposure light onto a portion of the resist layer to form an extrusion barrier region in the resist layer to define a plurality of pattern transfer regions corresponding to a plurality of separate windows;
aligning a template having a patterned surface with the resist layer, wherein the patterned surface of the template includes patterned regions and wherein each of the patterned regions includes a plurality of transfer patterns; and
pressing the template to perform an imprint step for embedding the transfer patterns of the template into the pattern transfer regions of the resist layer,
wherein the extrusion barrier region is formed as a lattice shape.

12. The method of claim 11, wherein the extrusion barrier region is formed by selectively curing the portion of the resist layer with the exposure light.

13. The method of claim 12, wherein selectively curing the portion of the resist layer includes:
aligning a photomask including opaque patterns and at least one light transmitting region defined by the opaque patterns with the resist layer so that the light transmitting region overlaps with a portion of the resist layer; and
irradiating an exposure light onto the photomask so that the exposure light selectively reaches the portion of the resist layer through the light transmitting region.

14. The method of claim 13, wherein the extrusion barrier region is a pattern forbidden region in which the transfer patterns are not transferred.

15. The method of claim 13, wherein the resist layer is formed by spin-coating a resist material on the substrate.

16. The method of claim 13, wherein the template includes a dam pattern, the dam pattern to be imprinted into a portion between the extrusion barrier boundary region and the pattern transfer region.

* * * * *